(12) United States Patent
Mori et al.

(10) Patent No.: US 6,487,018 B1
(45) Date of Patent: Nov. 26, 2002

(54) APERTURE AND OPTICAL DEVICE USING THE SAME

(75) Inventors: Masayoshi Mori, Hyogo (JP); Akira Chiba, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/388,644

(22) Filed: Feb. 14, 1995

(30) Foreign Application Priority Data

Mar. 11, 1994 (JP) ........................................ 6-041217 (P)

(51) Int. Cl.⁷ .............................. G02B 5/18; G02B 5/22; G03F 9/00
(52) U.S. Cl. ............................ 359/569; 359/891; 430/5
(58) Field of Search ........................... 372/25; 359/562, 359/569, 572, 571, 891; 430/5; 355/74

(56) References Cited

U.S. PATENT DOCUMENTS

| 4,568,180 A | * | 2/1986 | Kogane ..................... 355/74 |
| 5,275,896 A | * | 1/1994 | Garofalo et al. ............ 430/5 |
| 5,348,826 A | * | 9/1994 | Dao et al. .................. 430/5 |
| 5,380,608 A | * | 1/1995 | Miyashita et al. .......... 430/5 |
| 5,446,587 A | * | 8/1995 | Kang et al. ................ 359/562 |
| 5,504,621 A | * | 4/1996 | Okayama et al. .......... 359/569 |

FOREIGN PATENT DOCUMENTS

| EP | 0476 931 A2 | 3/1992 |
| JP | 60-132325 | 7/1985 |
| JP | 6-181153 | 6/1994 |

OTHER PUBLICATIONS

J. Cordingley, "Application of a binary diffractive optic for beam shaping in semiconductor processing by lasers", Applied Optics, vol. 32, No. 14, May 10, 1993, pp. 2538–2542.

* cited by examiner

Primary Examiner—Andrey Chang
(74) Attorney, Agent, or Firm—McDermott, Will & Emery

(57) ABSTRACT

An aperture used in an optical device includes a first light-transmitting region which transmits light emitted from a light source which is provided in the optical device, and a second light-transmitting region which is provided in the periphery of the first light-transmitting region and provides light passing therethrough with a phase difference of 180° with respect to light passing through the first light-transmitting region. Thus, improvement in a function which is required for the optical device can be achieved.

4 Claims, 14 Drawing Sheets

APERTURE AND OPTICAL DEVICE USING THE SAME

BACKGROUND OF THE INVENTION

1. Field of the Invention

The present invention relates to an aperture and an optical device using it, and more particularly, the present invention aims at improving a structure of the aperture and thus a function which is required for the optical device.

2. Description of the Background Art

Recently, various optical devices have been used for manufacturing of a semiconductor device. A structure of these optical devices includes a light source for emitting a light beam, a collimator lens for making a light beam parallel, an aperture for shaping a light beam passing through the collimator lens into a prescribed shape, and an objective lens for condensing a light beam passing through the aperture.

An optical device with the above-described structure includes, for example, a photomask defect repairing apparatus for repairing a defect found in a photomask, and a scanning critical dimension measurement apparatus for measuring the dimension of a pattern which is formed on a semiconductor substrate. The photomask defect repairing apparatus for repairing a defect which has been found in a photomask will now be described.;

Referring to FIG. 11, in a photomask 200, a metal thin film 208 which includes a light-transmitting portion 206 and a light-shielding portion 204 is formed on a transparent glass substrate 202. About 10 to 20 kinds of photomasks 200 each of which has a different pattern are required to manufacture a single semiconductor device. If a defect exists in these photomasks, the defect also is transferred to a wafer, resulting in poor quality and reduced yield of the semiconductor device.

A defect which could be found in photomask 200 can be classified into two types: a remaining defect 210 and a pinhole defect 220. In order to repair pinhole defect 220, a carbon-type film 224 is usually deposited and filled in pinhole defect portion 220 by an FIB assist deposition system.

In order to repair remaining defect portion 210, a laser beam 222 is collected and directed to remaining defect portion 210 and the metal thin film is removed. A device using YAG (Yttrium, Aluminum, Gahnite) laser has been practically available. Higher resolution has been achieved by use of second harmonics (wavelength of 0.53 $\mu$m) of YAG laser, and a mask defect repairing apparatus using the second harmonics, therefore, has been used increasingly.

The basic structure of this mask defect repairing apparatus is disclosed in Japanese Patent Laying-Open No. 60-132325. Referring to FIG. 12, the structure of the mask defect repairing apparatus 250 which has been disclosed in Japanese Patent Laying-Open No.60-132325 includes a light source (Nd. YAG laser) 252 for emitting a light beam 254, a collimator lens 256 for making light beam 254 parallel, a variable rectangular aperture 258 for shaping laser beam 254 passing through collimator lens 256 into a prescribed shape, and an objective lens 260 for condensing laser beam 254 passing through aperture 258 into a defective portion 264 on a photomask 262.

Referring to FIG. 13, aperture 258 used in this mask defect repairing apparatus 250 is constituted by an opening 268 for shaping laser beam 254 into a prescribed rectangular shape, and a light-shielding portion 266 for intercepting a laser beam.

The structure of a critical dimension measurement apparatus 300 will now be described with reference to FIG. 14. Critical dimension measurement apparatus 300 includes a light source 302 for emitting a laser beam 301a, a collimator lens 304 for making laser beam 301a parallel laser beam 301b, an aperture 306 for shaping laser beam 301b into a laser beam 301c having a prescribed rectangular shape, and an objective lens 310 for condensing laser beam 301c into a surface of a wafer 314. This wafer 314 includes a pattern 314a with a prescribed shape, which is made of conductive material, insulating material or the like, formed on a substrate 314b. A laser beam is reflected from wafer 314 and then from a semi-transparent mirror 308, and enters a detector 312.

Width d of pattern 314a is measured, referring, for example, to FIG. 15, when laser beam 301d is moved with respect to pattern 314a in the direction shown by an arrow and change in intensity between light beams 301d reflected from substrate 314b and from pattern 314a is recognized by detector 312.

Principle of measurement of width d of pattern 314a will now be described with reference to FIG. 16. In FIG. 16, abscissa indicates a ratio of half-width W of a scanning beam (laser beam) to width d of a pattern, and ordinate indicates intensity of a signal indicated by a reflected light beam which is received by a detector. Resolution of the critical dimension measurement apparatus will now be described with reference to FIG. 16. Resolution is usually represented by a W/d value that is obtained just before the decrease of intensity of a reflected light beam. For example, pattern width d can be measured, if two edge portions of the pattern can be recognized. Therefore, as understood from FIG. 16, pattern width d can be measured so long as the W/d value is 2.0 or less. This is explained in more detail with reference to FIGS. 17–21.

FIG. 17 shows change in signal intensity when a scanning beam moves across a substrate and W/d is 0.5. By representing intensities of signals received from substrate 314b and pattern 314a as A and B (A>B), respectively, the signal intensity becomes (A+B)/2 when the central point of the scanning beam comes to an edge portion of pattern 314a. Therefore, pattern width d can be measured if signal intensity of (A+B)/2 can be recognized.

FIG. 18 shows change in signal intensity when a scanning beam moves across a substrate and W/d is 1.0. In this case, pattern width d can be measured by recognizing signal intensity of (A+B)/2, as shown in FIG. 17.

FIG. 19 shows change in signal intensity when a scanning beam moves across a substrate and W/d is 2.0. In this case, pattern width d can be easily measured, since the range in which signal intensity is (A+B)/2 will correspond to pattern width d.

FIG. 20 shows change in signal intensity when a scanning beam moves across a substrate and W/d is 2.5. In this case, the range in which signal intensity is (A+B)/2 cannot be recognized. Therefore, pattern width d cannot be measured.

From above description, it is to be understood that patten width d cannot be measured when W/d is more than 2.

Recently, with miniaturization of a semiconductor device, improvement in degree of integration and in function of the semiconductor device has been desired, resulting in requirement of further miniaturization of an element which is formed in a semiconductor device. Therefore, optical devices such as a pattern defect repairing apparatus and a critical dimension measurement apparatus which can deal with the miniaturization have been required.

In these optical devices, spot, that is, half-width of a laser beam must be reduced in order to deal with miniaturization of a pattern. Reduction in half-width can be achieved by reducing an opening width of an aperture. Half-width can be reduced when the opening width of the aperture is larger than a wavelength of light, while diffraction of light might introduce a problem when the opening width of the aperture becomes smaller with miniaturization of a pattern. This is illustrated in FIGS. 21A to 21D. Light has such a clear amplitude as shown in FIG. 21B right after passing through the aperture. Light projected onto a wafer, however, has an amplitude that is widened at its bottom, such as shown in FIG. 21C, because of diffraction of light. Therefore, light on the wafer has an intensity which is not sharp as shown in FIG. 21D, resulting in increase in half-width.

It is known that light passing through the aperture has the corners rounded with radius of curvature of about the wavelength of light because of the above-described diffraction. When a laser beam, for example, of 0.53 $\mu$m is used, the minimum half-width of the laser beam will be 1.06 $\mu$m. Therefore, in repairing a pattern defect, it is very difficult to repair with high accuracy a remaining defect in a pattern of 1 $\mu$m wide.

In the critical dimension measurement apparatus, when half-width is 1.06 $\mu$m, pattern width of less than 0.53 $\mu$m cannot be measured, since the above-described W/d becomes larger than 2.0.

SUMMARY OF THE INVENTION

It is an object of the present invention to provide an aperture by which reduction in diffraction of light passing through the aperture and in half-width of light can be achieved, and to provide an optical apparatus using this aperture.

An aperture in accordance with one aspect of the present invention is intended to be used in an optical device and includes a first light-transmitting region and a second light-transmitting region.

The first light-transmitting region transmits light emitted from a light source which is provided in the optical device. The second light-transmitting region is provided in the periphery of the first light-transmitting region and provides light passing therethrough with a phase difference of 180° with respect to light passing through the first light-transmitting region.

Thus, since part of light passing through the first light-transmitting region, in particular, through the peripheral edge portion thereof is offset by light passing through the second light-transmitting region and having a phase difference of 180°, increase in half-width due to diffraction of light passing through the first light transmitting region can be prevented. Accordingly, half-width of light passing through the first light-transmitting region can be reduced, resulting in a clear optical image.

An aperture in accordance with another aspect of the present invention is intended to be used in an optical device and includes a phase shift substrate which has a first opening with a prescribed shape and provides light passing therethrough with a phase,difference of 180°, and a light-shielding substrate which has a second opening similar to and larger than the first opening and intercepts light. The phase shift substrate and the light-shielding substrate are positioned so that the first opening is surrounded by the second opening.

Preferably, the phase shift substrate and the light-shielding substrate are positioned on a transparent substrate which transmits light.

More preferably, the phase shift substrate is made of glass which is selected from the group consisting of oxide glass, soda-lime glass, borosilicate glass, lead glass, alumina-silicate glass, borate glass, phosphate glass, aluminate glass, titanate glass, fluoride glass, chalcogenide glass, metal glass, and crystallized glass.

This aperture includes a first opening through which light passes, and a light-shielding substrate having such a second opening that exposes only the periphery of the first opening of a phase shift substrate which provides light passing therethrough with a phase difference of 180°.

Thus, since part of light passing through the first opening, in particular, through the peripheral edge portion thereof is offset by light of which phase is shifted by 180°0 through the phase shift substrate which is exposed by the second opening in the periphery of the first opening, increase in half-width due to diffraction of light passing through the first opening can be prevented. Accordingly, half-width of light passing through the first opening can be reduced, resulting in a clear optical image.

An aperture in accordance with further aspect of the present invention is intended to be used in an optical device, and includes a phase shift substrate and a light-shielding substrate.

The phase shift substrate includes a first light-transmitting portion with a prescribed thickness, and a second light-transmitting portion which is thicker than the first light-transmitting portion and provides light passing therethrough with a phase difference of 180° with respect to light passing through the first light-transmitting portion.

The light-shielding substrate exposes only the first light-transmitting portion and a prescribed region of the second light-transmitting portion, which is located in the periphery of the first light-transmitting portion, and shields the other region thereof from light.

In this aperture, since part of light passing through the first light-transmitting portion, in particular, through the peripheral edge portion thereof is offset by light passing through the second:light-transmitting portion and having a phase difference of 180°, increase in half-width due to diffraction of light passing through the first light-transmitting portion can be prevented. Accordingly, half-width of light passing through the first light-transmitting portion can be reduced, resulting in a clear optical image.

An optical device in accordance with the present invention includes an aperture which has a second light-transmitting region which proves light passing therethrough with a phase difference of 180° with respect to light passing through the periphery of a first light-transmitting region.

Thus, since part of light passing through the first light-transmitting region, in particular, through the peripheral edge portion thereof is offset by light passing through the second light-transmitting portion and having a phase difference of 180°, increase in half-width due to diffraction of light passing through the first light-transmitting region can be prevented. Accordingly, reduction in half-width of light passing through the first light-transmitting region can be achieved.

As a result, a function which is required for an optical device can be improved, and, for example, a pattern defect repairing apparatus will be able to repair a defect in a finer pattern, and a critical dimension measurement apparatus will be able to measure the dimension of a finer pattern.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3C are diagrams of the aperture and amplitude light passing therethrough, in which FIG. 3A is a sectional view of the aperture in accordance with the first embodiment, FIG. 3B is a diagram of an amplitude of light right after passage through the aperture shown in FIG. 3A, and FIG. 3C is a diagram of an amplitude of light on a plane at which light having passed through the aperture shown in FIG. 3A is received.

FIGS. 21A–21D are diagrams of a conventional aperture and amplitude and intensity of light passing therethrough in which FIG. 21A is a sectional view showing a structure of the conventional aperture, FIG. 21B is a diagram showing an amplitude of light right after passage through the aperture shown in FIGS. 21A and 21C are diagrams showing an amplitude of light on a plane at which light having passed through the aperture shown in FIG. 21A is received, and FIG. 21D is a diagram showing an intensity of light on a plane at which light having passed through the aperture shown in FIG. 21A is received.

DESCRIPTION OF THE PREFERRED EMBODIMENTS

Structure of an aperture in accordance with a first embodiment of the present invention will now be described with reference to FIGS. 1 and 2.

Figure 1:
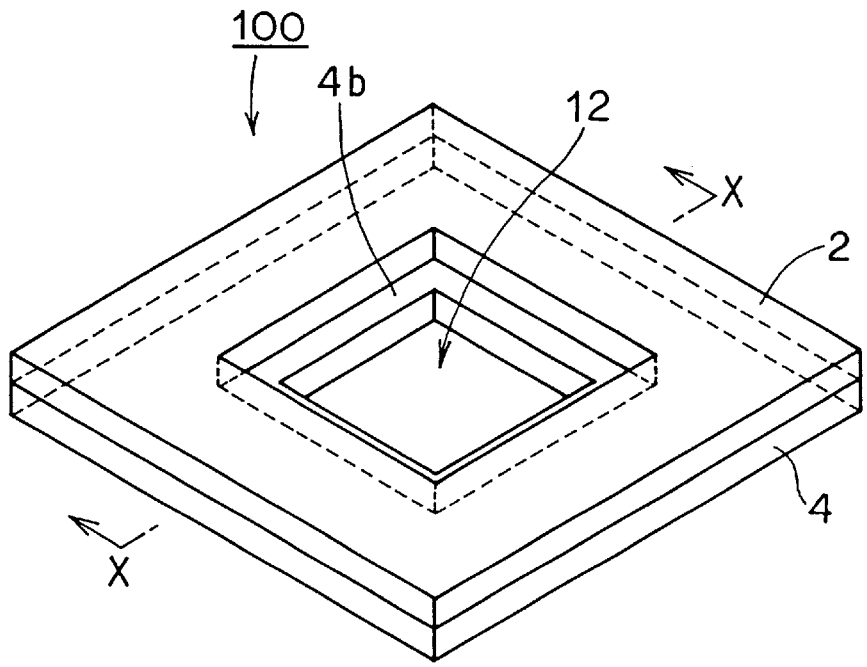
FIG. 1 is a perespective view of an aperture in accordance with a first embodiment of the present invention.
Figure 2:
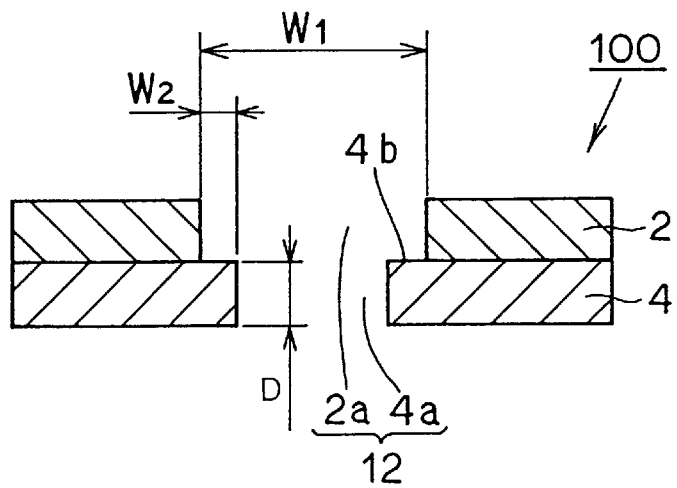
FIG. 2 is a sectional view taken along line X—X in FIG. 1.

Referring to FIGS. 1 and 2, aperture 100 of the first embodiment includes a phase shift substrate 4 which provides a phase difference of 180° to light passing therethrough, and a light-shielding substrate 2 which intercepts light.

Phase shift substrate 4 is usually made of glass material such as oxide glass, soda-lime glass, borosilicate glass, lead glass, alumina-silicate glass, borate glass, phosphate glass, aluminate-glass, titanate glass, fluoride glass, chalcogenide glass, metal glass, crystallized glass or the like, or is made of film such as silicon nitride (SiN) film, silicon carbonate (SiC) film, chromium oxide (CrO) film, molybdenum silicide oxide (MoSiO) film, molybdenum silicide nitride (MoSiN) film, molybdenum silicide oxide nitride film (MoSiON), PMMA (Poly Methyl Methacrylate) film or the like. Thickness D of phase shift substrate 4 is defined by the following equation.

$$D = \frac{\lambda}{2(n_1 - n_0)} \cdot (2m - 1) \quad (m = 1, 2, 3, \ldots) \quad (1)$$

where $\lambda$ is a wavelength of light which is emitted from a light source, $n_0$ is a refractive index of atmosphere, and $n_1$ is a refractive index of a phase shift substrate. The phase shift substrate 4 has an opening 4a of a prescribed shape.

Light-shielding substrate 2 is made of material such as aluminum, copper, silicon, plastic or the like. Light-shielding substrate 2 has its thickness selected such that it intercepts light completely. Light-shielding substrate 2 has an opening 2a which is similar to and larger than opening 4a.

Light-shielding substrate 2 and phase shift substrate 4 are positioned so that opening 4a is surrounded by opening 2a. These openings 2a and 4a form a light-transmitting portion 12, and an exposed portion of phase shift substrate 4 forms a phase: shifter portion 4b. The relationship between width ($W_1$) of opening 2a and width ($W_2$) of phase shifter portion 4b is defined by the following equation.

$$W_2 = \left(\frac{1}{20} \sim \frac{9}{20}\right) W_1 \quad (2)$$

Amplitude and intensity of light passing through aperture 100 with the above-described structure will now be described with reference to FIGS. 3A–3C and FIG. 4.

Figure 3A:
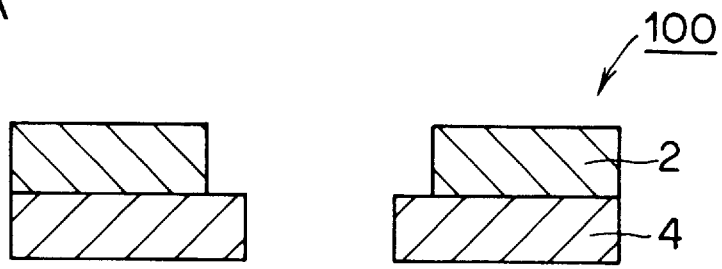
Figure 3B:
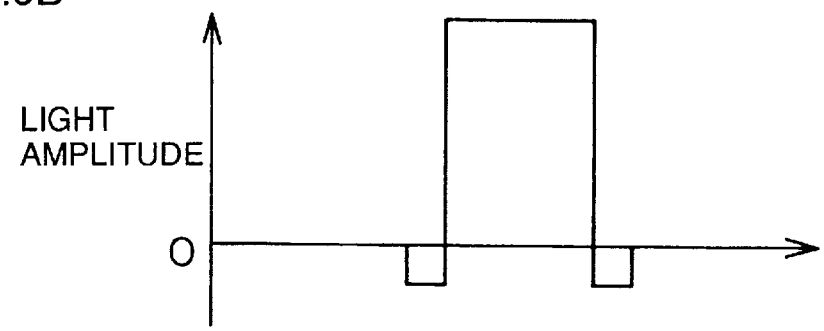
Figure 3C:
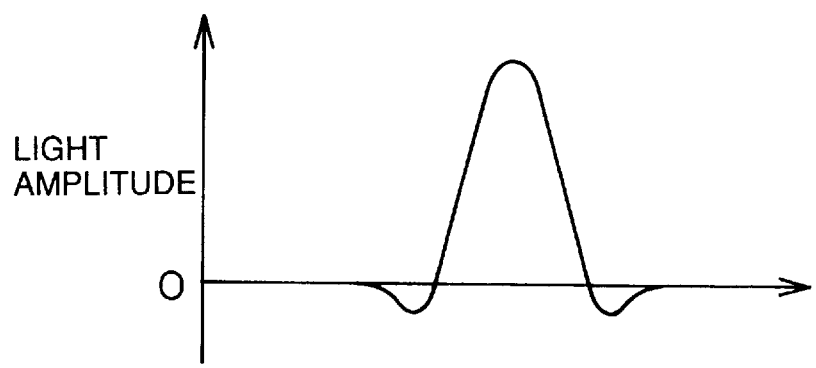

Light has such an amplitude as shown in FIG. 3B right after passing through aperture 100 which has a cross section shown in FIG. 3A. That is, light passing through light-transmitting portion 12 does not change in amplitude, and light passing through phase shifter portion 4b has an amplitude of which phase is shifted by 180° with respect to that of light passing through light-transmitting portion 12. Then, light passing through aperture 100 comes to have such an amplitude distribution as shown in FIG. 3C due to diffraction of light and the like.

Distribution of resulting light intensity will now be described with reference to FIG. 4. The following is description of the case where laser beam of second harmonics of Nd. YAG laser (wavelength of 530 $\mu$m) is used to simulate the distribution of intensity of laser beam passing through the above-described aperture 100. In this simulation, refractive index of phase shift substrate 4 is set to 1.46.

An equation which is used for the above-described simulation will now be described. When (x', y') and (x, y) represent coordinates on the aperture and coordinates on a plane at which light is received, respectively, distribution U (x, y) of light amplitude on the plane at which light having passed through the aperture and an objective lens is received is given by the following equation.

$$U(x, y) = \iint_A F(x', y') G(x'-x, y'-y) dx' dy' \quad (3)$$

where A is an area of the aperture through which light passes, F(x', y') is an amplitude transmittance function of the aperture, and G(x'-x, y'-y) is an amplitude distribution of Fraunhofer diffraction image of light passing through the objective lens and a circular opening.

When a conventional aperture is used, F (x', y') is 1 in the entire opening with variable rectangular shape, and F (x', y') is 0 in other region, since a laser beam does not pass therethrough.

In accordance with aperture 100 of the first embodiment, change Δθ in phase is introduced into amplitude transmittance function in phase shifter portion 4b of phase shift substrate 4 as shown in cross section of FIG. 2. This change in phase can be controlled by a thickness of phase shift substrate 4, as shown in equation (1). If amplitude transmittance function is applied to phase shifter portion 4b and opening 4a of the aperture, amplitude distribution of a laser beam on a plane at which the laser beam is received is given by the following equation.

$$U(x, y) = \exp(j\Delta\theta)(\iint_{A_1} G'(x'-x, y',-y) dx' dy' - \iint_{A_2} G'(x'-x, y'y)1 dx'dy') + \iint_{A_2} G(x'-x, y'-y) dx' dy' \quad (4)$$

where $A_1$ is an area of opening 4a, $A_2$ is an area of phase shifter portion 4b, and G' (x'-x, y'-y) is a function determined taking into account the fact that a laser beam has been reduced in wavelength when it passed through phase shift substrate 4, by refractive index of phase shift substrate 4 having the above-described function G(x'-x, y'-y). Intensity distribution I (x, y) of a laser beam on a plane at which the laser beam is received can be calculated from the following equation.

$$I(x,y) = u(x, y) \cdot u'(x, y) \quad (5)$$

where u' (x,y) is a conjugate complex function.

Figure 4:
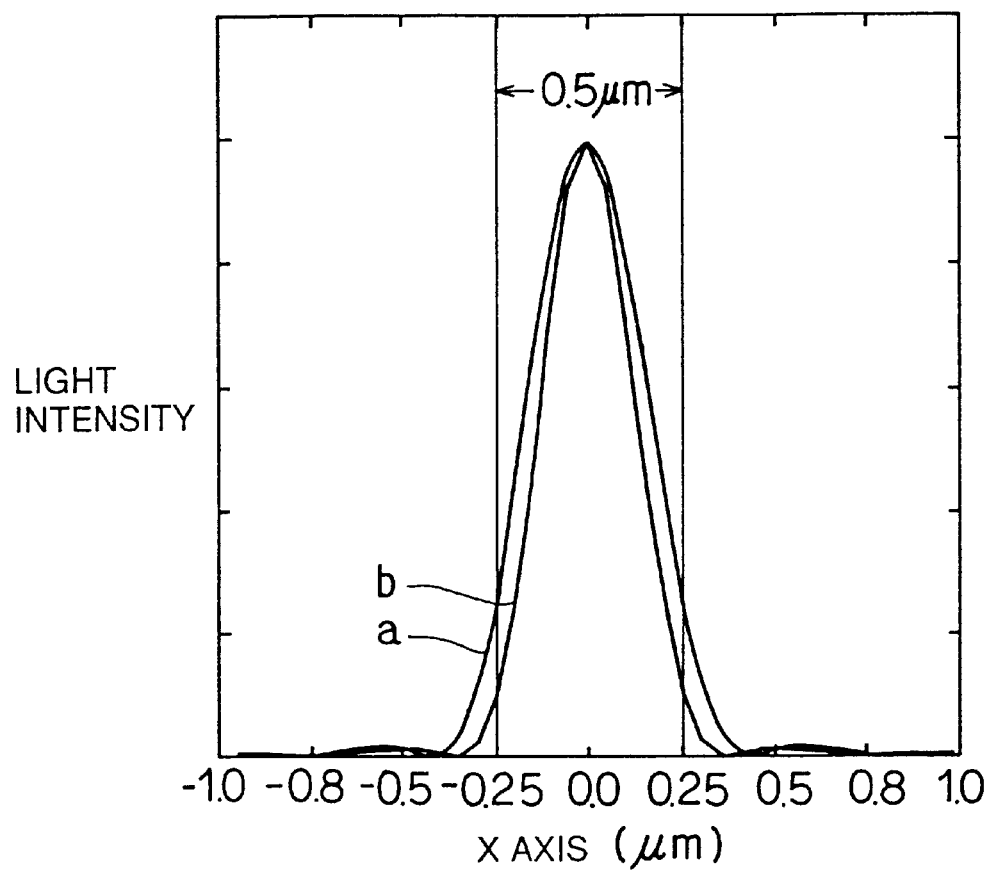
FIG. 4 is a diagram of an intensity of light on a plane at which light having passed through the aperture in accordance with the first embodiment is received.

FIG. 4 shows a result of simulating, using equation (5), distribution of light intensity on a plane at which a light beam with a wavelength of 0.53 μm is received. In this case, numerical aperture (N.A) of the objective lens is 0.75 and a width of an image of the aperture on the plane at which light is received is 0.5 μm.

FIG. 4 shows distributions (a) and (b) of light intensity when a conventional aperture and the aperture of this embodiment are used, respectively. As will be understood from the result of this simulation, use of the aperture in accordance with this embodiment will reduce half-width by about 20% with respect to the conventional one.

In accordance with this embodiment, since part of light passing through opening 4a, in particular, through the peripheral edge portion thereof is offset by light passing through phase shifter portion 4b and having a phase difference of 180°, increase in half-width due to diffraction of light passing through opening 4b can be prevented, resulting in reduction in half-width of light passing through opening 12.

Figure 5:
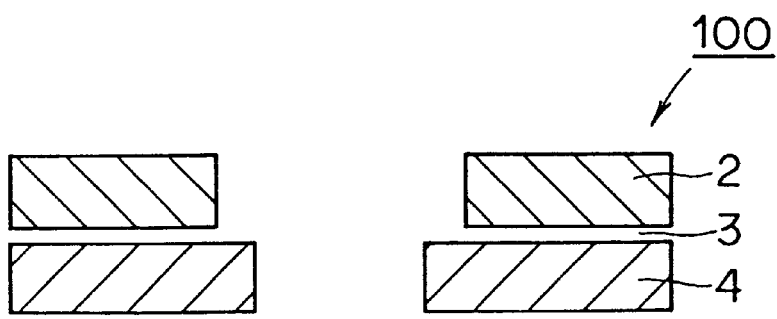
FIG. 5 is a sectional view showing another structure of the aperture in accordance with the first embodiment.

In the cross section of FIG. 2, although phase shift substrate 4 and light-shielding substrate 2 are placed so as to be in contact with each other, the aperture is not limited to this structure and these substrates may be placed with a space 3 therebetween, as shown in FIG. 5.

Figure 6:
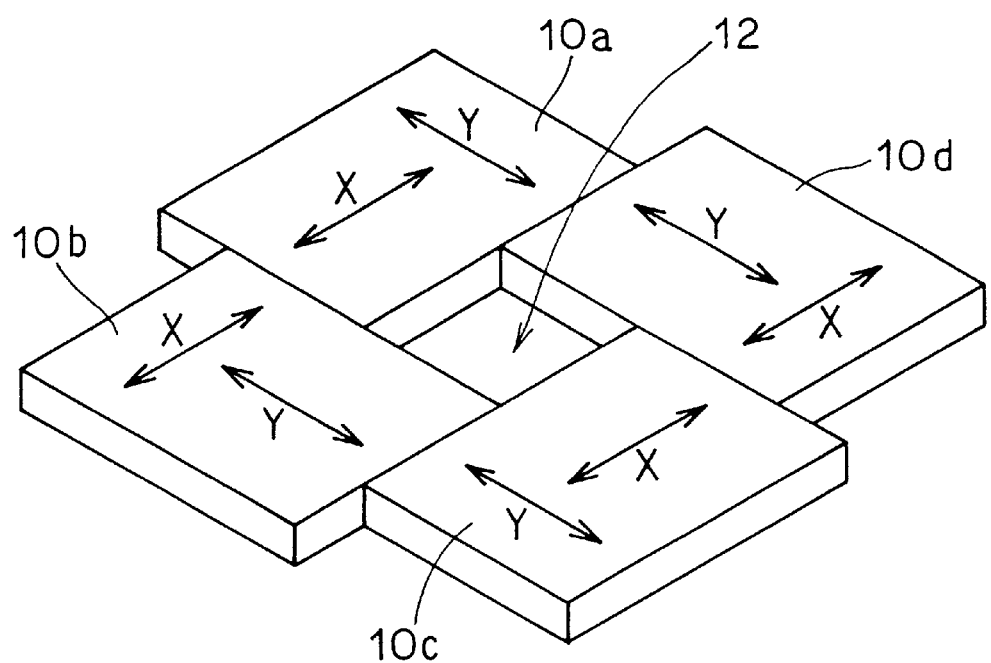
FIG. 6 is a perspective view showing a further structure of the aperture in accordance with the first embodiment.

In order to vary an open area of apertures 4a and 2a, in the case of the phase shift substrate, for example, four phase shift substrates 10a–10d may be placed in such a manner as shown in FIG. 6 and moved appropriately in the directions of arrows X and Y, whereby opening 12 with an arbitrary shape can be formed.

When the aperture of this embodiment is used in a pattern defect repairing apparatus, an image of light which is directed to a defect portion can be made smaller than in the prior art, thus smaller defect can be repaired. When the aperture of this embodiment is used in a critical dimension measurement apparatus, an image of light which is directed to a pattern to be measured can be made smaller than in the prior art and pattern width can be measured so long as W/d is 2 or less as described above with respect to the background art, thus smaller pattern width can be measured.

Structure of an aperture in accordance with a second embodiment of the present invention will now be described with reference to FIGS. 7 and 8.

Figure 7:
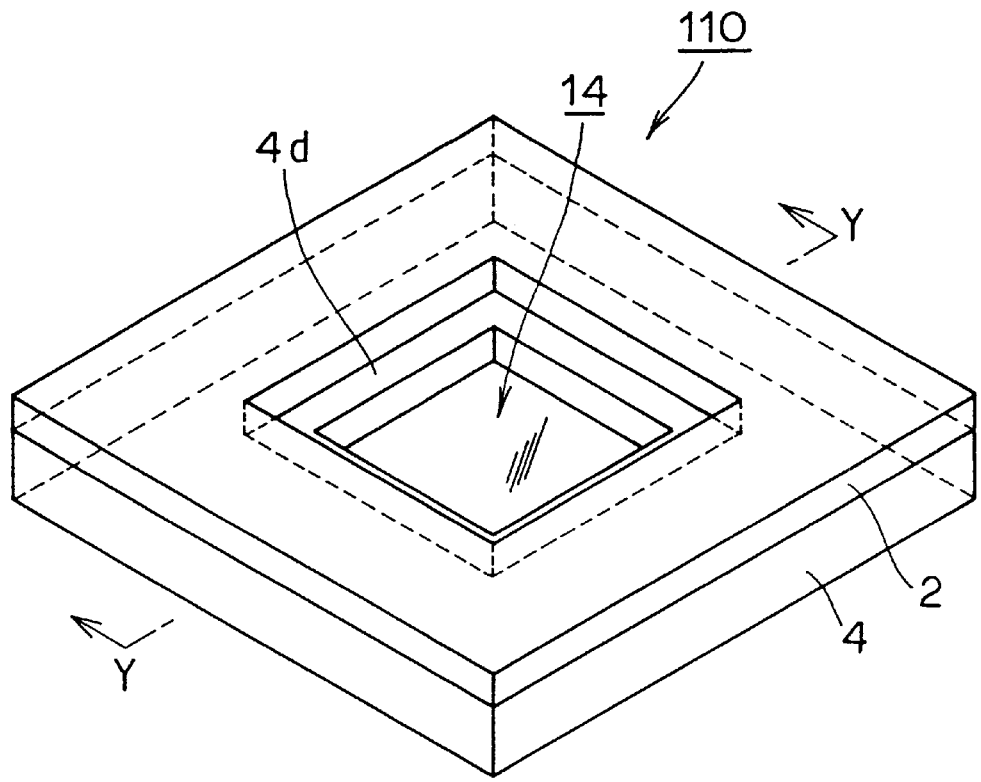
FIG. 7 is a perspective view of an aperture in accordance with a second embodiment.
Figure 8:
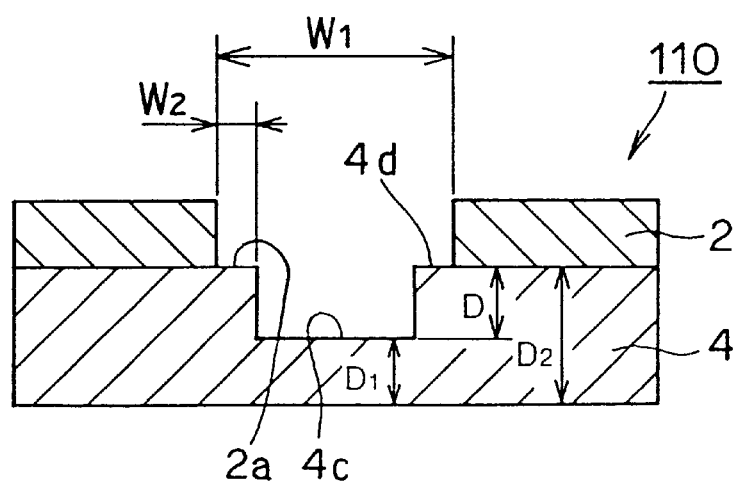
FIG. 8 is a sectional view taken along line Y—Y in FIG. 7.

Referring to FIGS. 7 and 8, an aperture 110 of the second embodiment includes a phase shift substrate 4 and a light-shielding substrate 2. A light-transmitting portion 4c with a thickness $D_1$ and a light-transmitting portion 4d with a thickness $D_2$ are formed in phase shift substrate 4 so that the light-transmitting portion 4c is surrounded by the light-transmitting portion 4d. In this case, relationship of thickness between light-transmitting portions 4c and 4d is defined by the following equation.

$$D = D_2 - D_1$$

where D needs to satisfy the equation (1), and $W_1$ and $W_2$ need to satisfy the equation (2), as in the first embodiment.

Phase shift substrate 4 is made of glass material such as oxide glass, soda-lime glass, borosilicate glass, lead glass, alumina-silicate glass, borate glass, phosphate glass, aluminate-glass, titanate glass, fluoride glass, chalcogenide glass, metal glass, crystallized glass or the like, or made of film such as silicon nitride (SiN) film, silicon carbonate (SiC) film, chromium oxide (CrO) film, molybdenum silicide oxide (MoSiO) film, molybdenum silicide nitride (MoSiN) film, molybdenum silicide oxide nitride film (MoSiON), PMMA (Poly Methyl Methacrylate) film or the like.

Light-shielding substrate 2 is placed on phase shift substrate 4 so that a prescribed region of light-transmitting portion 4d is exposed. Light-shielding substrate 2 is made of aluminum, copper, silicon, plastic or the like, and has its thickness selected such that it intercepts light completely.

In accordance with the second embodiment, since part of light passing through an opening 14, in particular, through the peripheral edge portion thereof is offset by light passing through phase shifter portion 4d and having a phase difference of 180°, increase in half-width due to diffraction of light passing through opening 14 can be prevented, resulting in reduction in half-width of light passing through opening 14. Although phase shift substrate 4 and light-shielding substrate 2 are in contact with each other in FIG. 8, the aperture of the present invention is not limited to this structure, and same effect can be obtained even if a prescribed space is provided therebetween as shown in FIG. 5 of the first embodiment.

Figure 9:
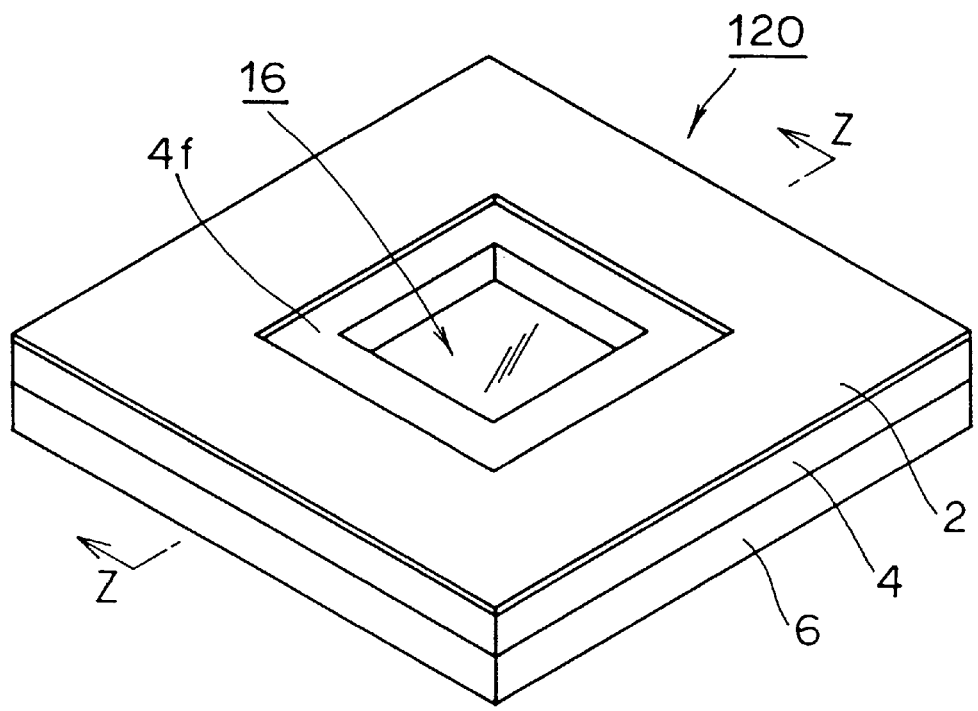
FIG. 9 is a perspective view of an aperture in accordance with a third embodiment.
Figure 10:
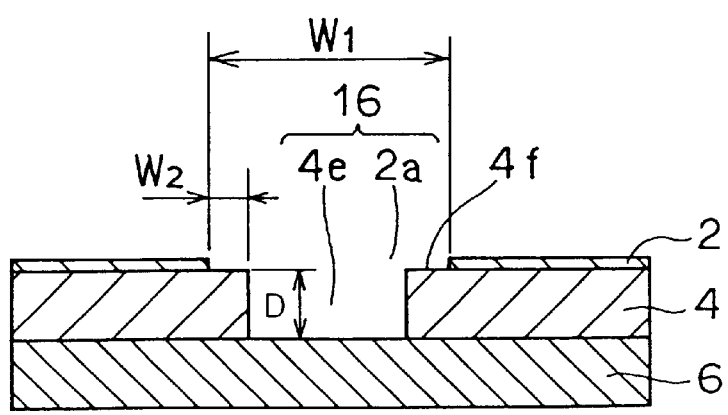
FIG. 10 is a sectional view taken along line Z—Z in FIG. 9.
Figure 11:
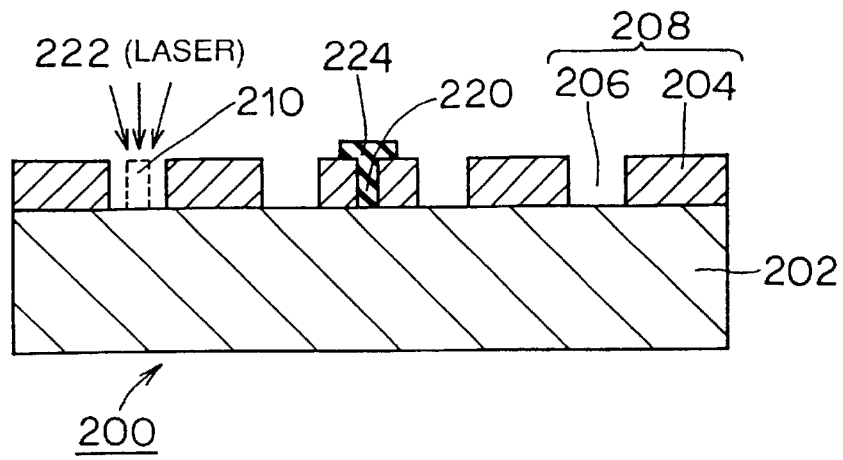
FIG. 11 is a sectional view illustrating a defect which has been found in a photomask and repair of the defect.
Figure 12:
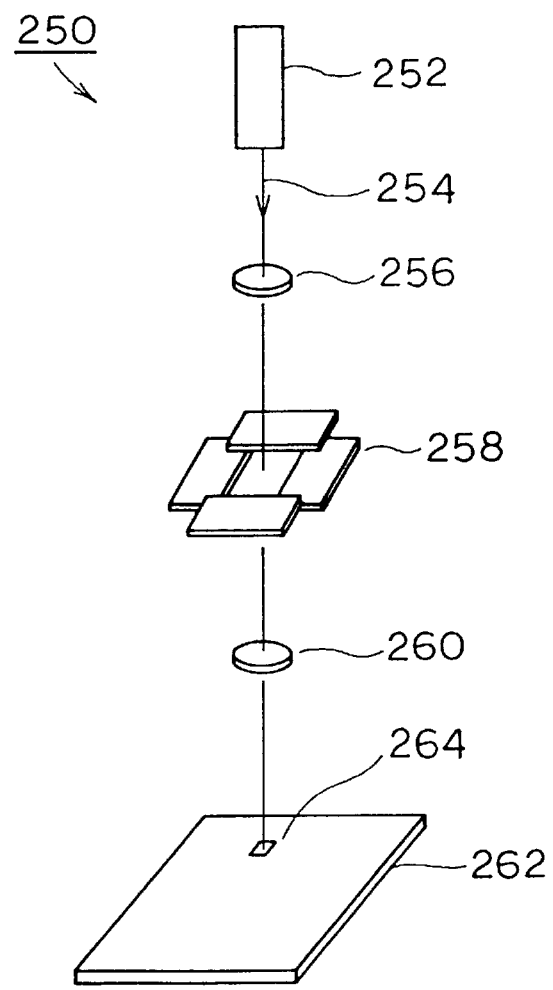
FIG. 12 is a diagram schematically showing a structure of a conventional defect repairing apparatus.
Figure 13:
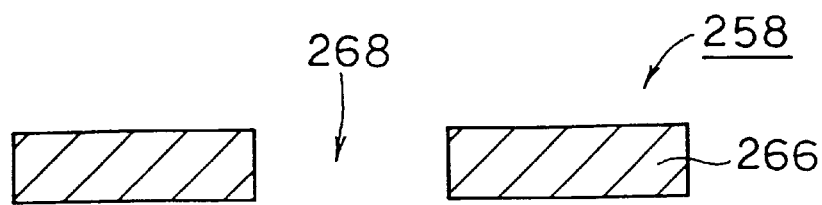
FIG. 13 is a sectional view showing a structure of a conventional aperture.
Figure 14:
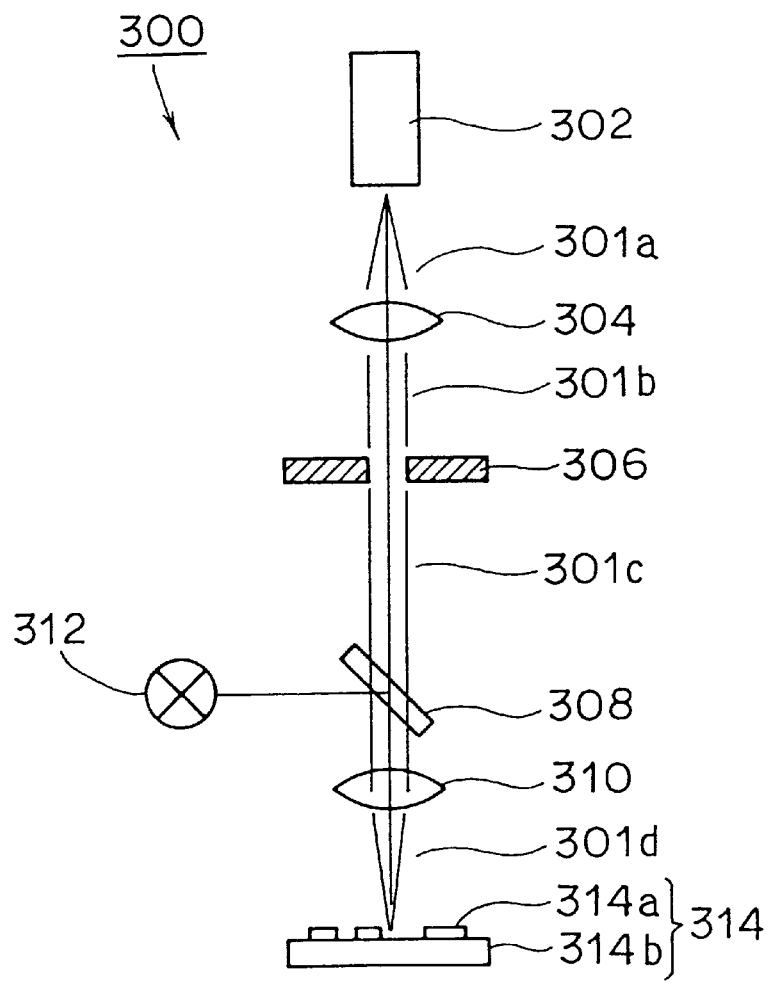
FIG. 14 is a diagram schematically showing a structure of a conventional critical dimension measurement apparatus.
Figure 15:
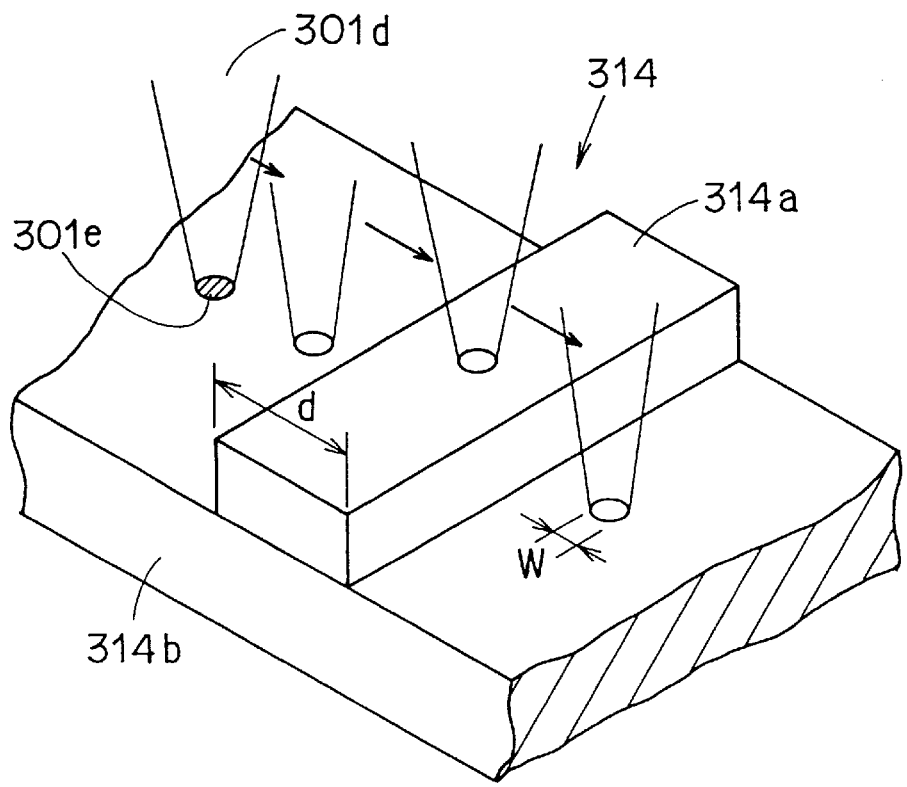
FIG. 15 is a diagram illustrating principle of measuring the dimension of a pattern in the critical dimension measurement apparatus.
Figure 16:
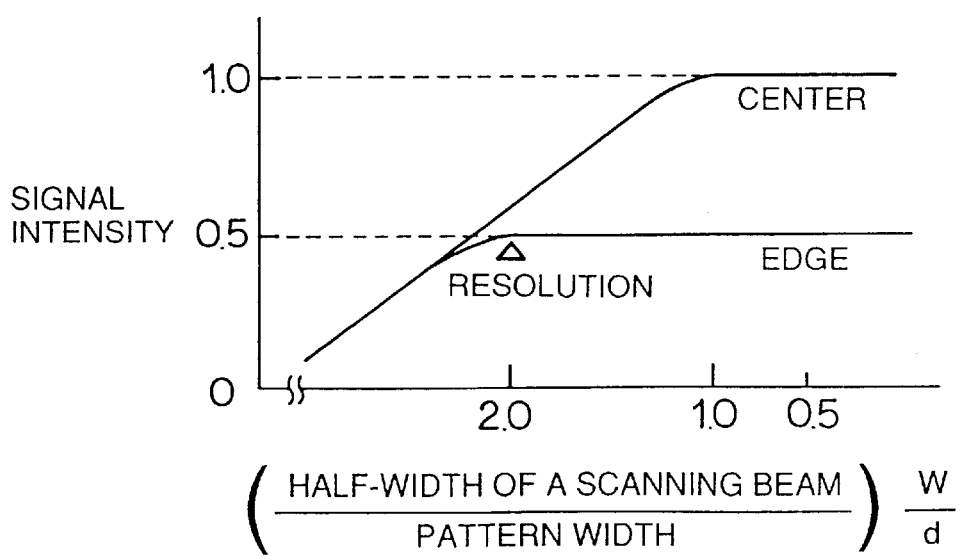
FIG. 16 is a diagram illustrating resolution of the critical dimension measurement apparatus.
Figure 17:
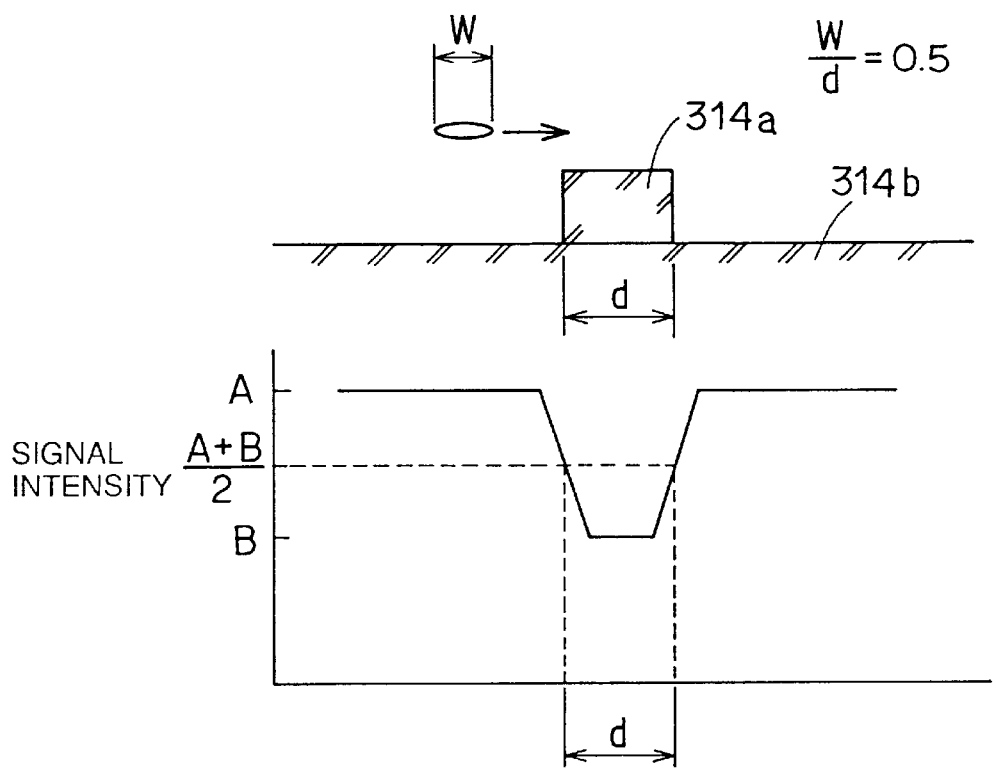
FIGS. 17–20 are diagrams illustrating the principle of measurement in the critical dimension measurement apparatus.
Figure 18:
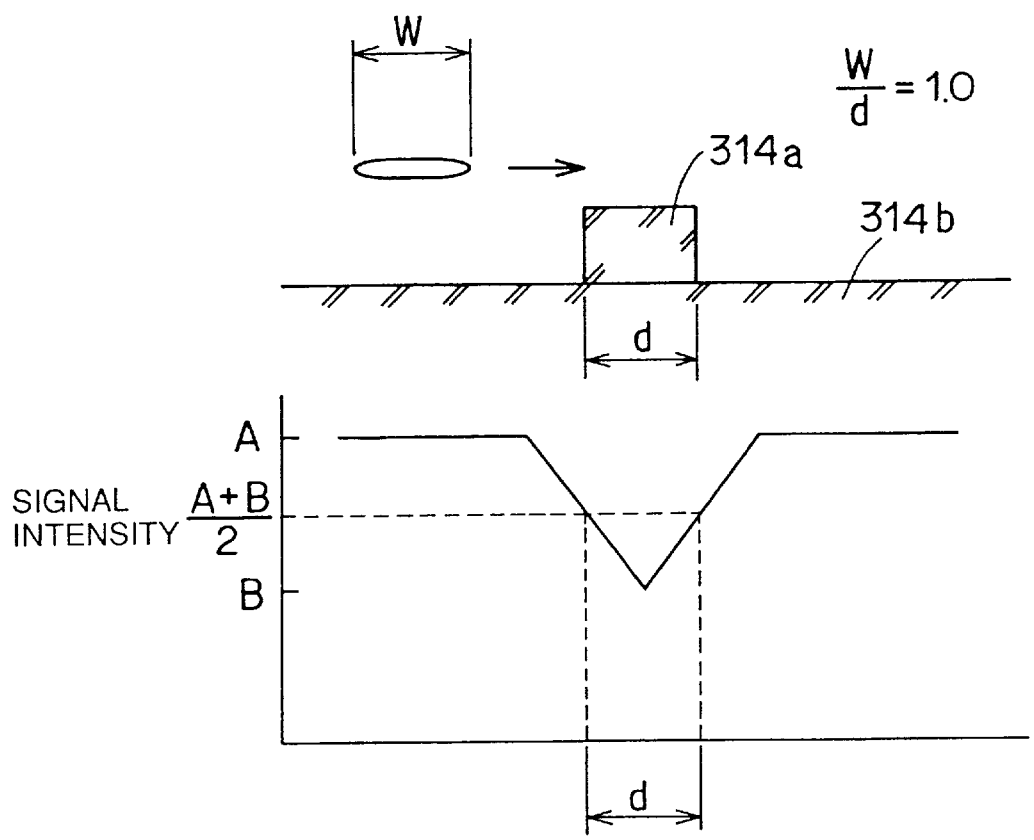
Figure 19:
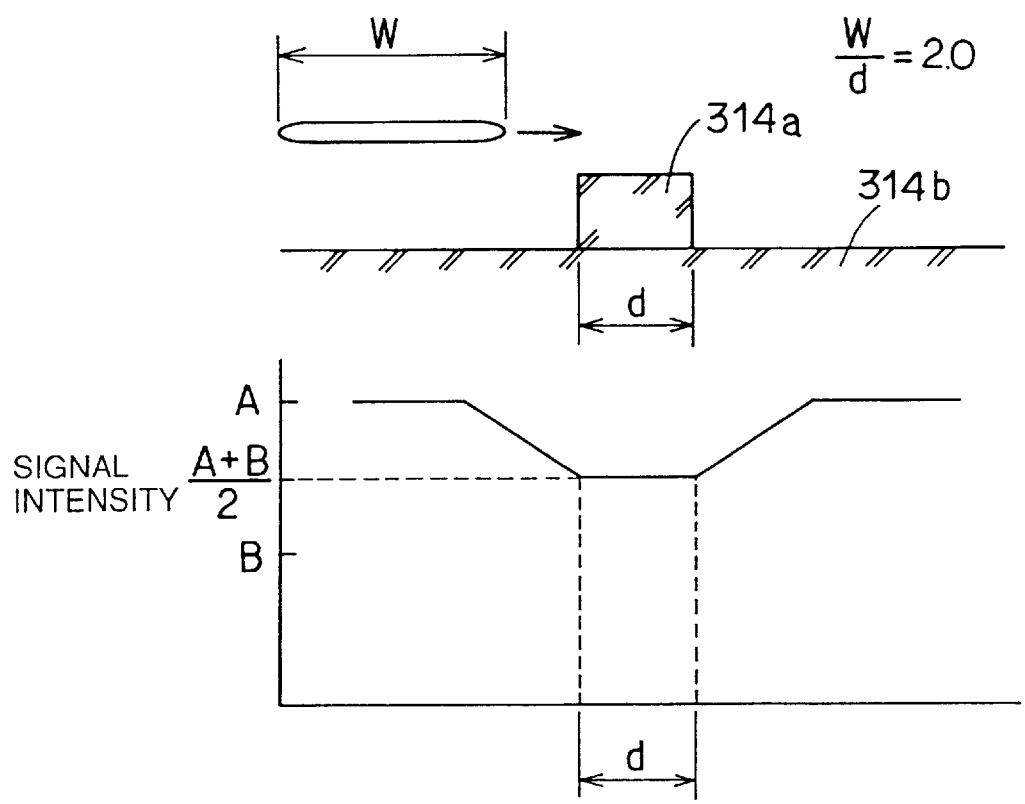
Figure 20:
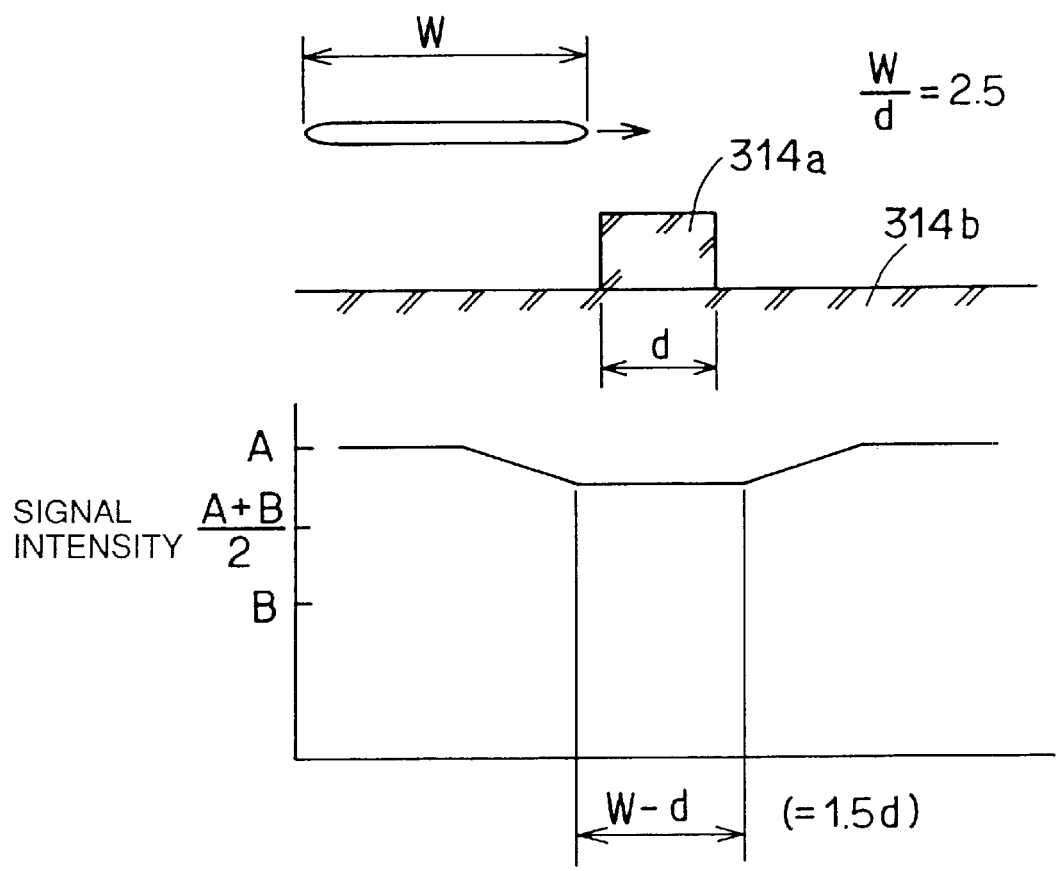
Figure 21A:
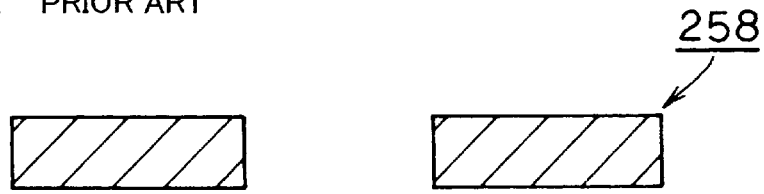
Figure 21B:
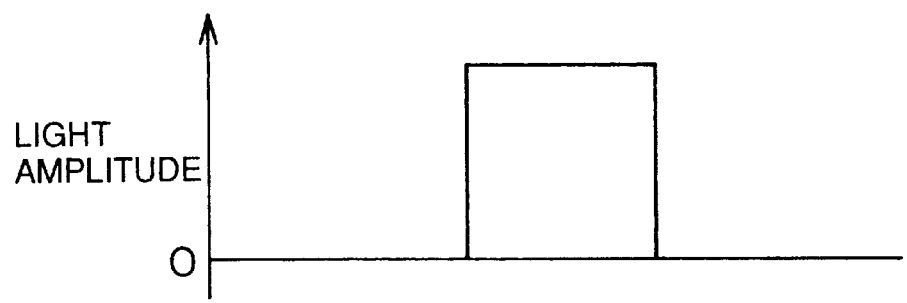
Figure 21C:
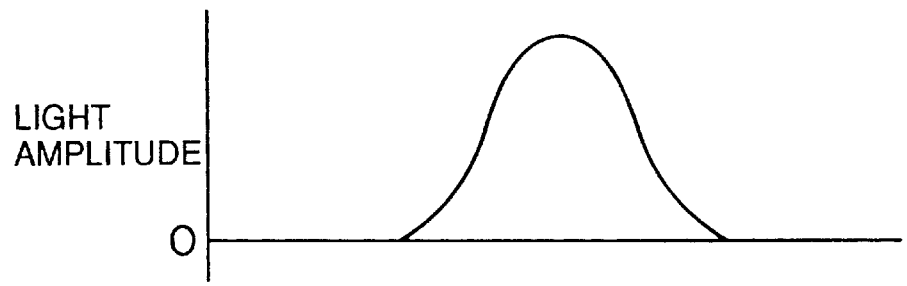
Figure 21D:
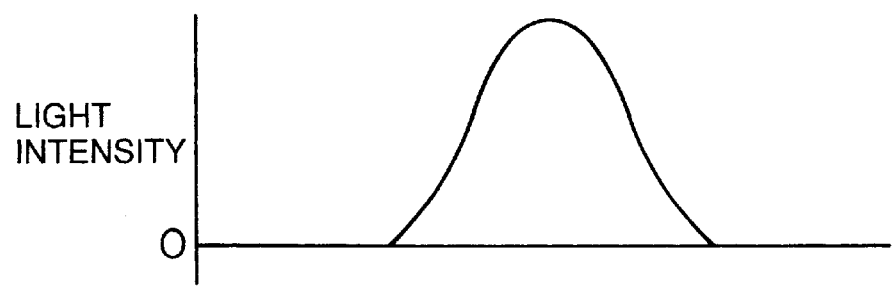

An aperture in accordance with a third embodiment of the present invention will now be described with reference to FIGS. 9 and 10. Referring to these figures, an aperture 120 of the third embodiment includes a phase shift substrate 4 which has an opening 4e with a prescribed shape, and a light-shielding substrate 2 which has an opening 2a which is similar to and larger than opening 4e.

Phase shift substrate 4 is made of dielectric film such as SOG, BPSG or the like. Thickness D of phase shift substrate 4 is given by the equation (1) which was described in the first embodiment. Light-shielding substrate 2 is made of material such as aluminum, copper, silicon, plastic or the like. Light-shielding substrate 2 has its thickness selected such that it is intercepts light completely.

Phase shift substrate 4 and light-shielding substrate 2 are placed so that opening 4e is surrounded by opening 2a.

openings 2a and 4e form a light-transmitting portion 16, and an exposed portion of phase shift substrate 4 forms a phase shifter portion 4f. Relation between opening 2a ($W_1$) and phase shifter portion 4f ($W_2$) is made to satisfy the equation (2) as in the case of the first embodiment.

In accordance with the third embodiment, since part of light passing through light-transmitting portion 16, in particular, through the peripheral edge portion thereof is offset by light passing through phase shifter portion 4f and having a phase difference of 180°, increase in half-width due to diffraction of light passing through light-transmitting portion 16 can be prevented, resulting in reduction in half-width of light passing through light-transmitting portion 16. Although light-shielding substrate 2 is placed on phase shift substrate 4 in FIG. 10, same effect can be obtained even if light-shielding substrate 2 is placed between glass substrate 6 and phase shift substrate 4.

When the aperture in accordance with each of the above-described embodiments is used in an optical device, for example, a photomask defect repairing apparatus, size of exposure light which is directed to a defect portion can be made smaller, thus smaller defect than in the prior art can be repaired. When the aperture in accordance with each of the above-described embodiments is used in a critical dimension measurement apparatus, half-width of light can be made smaller and dimension of a pattern can be measured so long as W/d is 2.0 or less as described above, thus dimension of smaller pattern can be measured.

Although a photomask defect repairing apparatus and a critical dimension measurement apparatus have been described as examples of an optical device, the optical device is not limited to these apparatuses, and same effect can be obtained by using the aperture in accordance with this embodiment before light enters an objective lens employed, for example, in a laser trimming apparatus, a soldering apparatus using FPIC, a laser CVD apparatus, a laser doping apparatus, a patterning apparatus using laser ablation, a rewritable optical disk apparatus, a YAG laser welding apparatus, a laser etching apparatus, and a hole making system capable of controlling hole diameter or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An aperture used in an optical device, comprising:
   a first rectangular light-transmitting region transmitting light emitted from a light source provided in said optical device; and
   a second light-transmitting region provided in a periphery of said first light-transmitting region, and providing light passing therethrough with a phase difference of 180° with respect to light passing through said first light-transmitting region, wherein
   said first light-transmitting regions is defined by respective four sides of four rectangular auxiliary transparent substrates, said auxiliary transparent substrates being arranged such that the defining side of any one of said auxiliary transparent substrates is slidable along a side perpendicular to the defining side of the adjacent auxiliary transparent substrate, and
   said second light-transmitting region is defined by respective four sides of four rectangular auxiliary phase shift substrates, said auxiliary phase shift substrates being arranges such that the defining side of any one of said auxiliary phase shift substrates is slidable along a side perpendicular to the defining side of the adjacent auxiliary phase shift substrate.

2. An aperture used in an optical device, comprising:
   a phase shift substrate having a first rectangular opening of prescribed shape, and providing light passing therethrough with a phase difference of 180°; and
   a light-shielding substrate having a second opening which is similar to and larger than said first opening, and intercepting light; wherein
   said first opening of said phase shift substrate is defined by respective four sides of four rectangular auxiliary chase shift substrates, said auxiliary phase shift substrates being arranged such that the defining side of any one of said auxiliary phase shift substrates is slidable along a side perpendicular to the defining side of the adjacent auxiliary phase shift substrate,
   said second opening of said light-shielding substrate is defined by respective four sides of four rectangular auxiliary light-shielding substrates, said auxiliary light-shielding substrates being arranged such that the defining side of any one of said auxiliary light-shielding substrates is slidable along a side perpendicular to the defining side of the adjacent auxiliary light shielding substrate, and
   said phase shift substrate and said light-shielding substrate are positioned such that said first opening is surrounded by said second opening.

3. The aperture according to claim 2, wherein
   said phase shift substrate and said light-shielding substrate are placed on a transparent substrate which transmits light.

4. An optical device, comprising:
   a light source for emitting a light beam;
   a first lens for making said light beam parallel;
   an aperture for shaping a light beam passing through said first lens into a prescribed shape; and
   a second lens for collecting a light beam passing through said aperture; wherein
   said aperture includes
     a first light-transmitting region transmitting light emitted from said light source, and
     a second light-transmitting region provided in a periphery of said first light-transmitting region, and providing light passing therethrough with a phase difference of 180° with respect to light passing through said first light-transmitting region, wherein
   said first light-transmitting region is defined by respective four sides of four rectangular auxiliary transparent substrates, said auxiliary transparent substrates being arranged such that the defining side of any one of said auxiliary transparent substrates is slidable along a side perpendicular to the defining side of the adjacent auxiliary transparent substrate, and
   said second light-transmitting region is defined by respective four sides of four rectangular auxiliary phase shift substrates, said auxiliary Phase shift substrates being arranged such that the defining side of any one of said auxiliary phase shift substrates is slidable along a side perpendicular to the defining side of the adjacent auxiliary phase shift substrate.

* * * * *